United States Patent [19]

Katayama et al.

[11] Patent Number: 5,191,451
[45] Date of Patent: Mar. 2, 1993

[54] ACTIVE MATRIX DISPLAY DEVICE HAVING DRAIN ELECTRODES OF THE PAIR OF TFTS BEING SYMMETRICALLY FORMED WITH RESPECT TO THE CENTRAL PLANE TO PREVENT THE FLICKER DUE TO THE DIFFERENT PARASITIC CAPACITANCES

[75] Inventors: Mikio Katayama, Ikoma; Naofumi Kondo, Nara; Yuzuru Kanemori, Tenri; Toshiaki Fujihara, Higashiosaka; Hiroshi Fujiki, Tenri; Kiyoshi Nakazawa, Fujiidera, all of Japan

[73] Assignee: Sharp Kabushiki Kaisha, Japan

[21] Appl. No.: 685,680

[22] Filed: Apr. 16, 1991

[30] Foreign Application Priority Data

Apr. 20, 1990 [JP] Japan ................................ 2-105982

[51] Int. Cl.⁵ .............................................. G02F 1/13
[52] U.S. Cl. ......................................... 359/59; 359/61; 359/66; 257/59
[58] Field of Search .................. 359/66, 58, 59, 61; 340/784; 357/2, 4, 23.7

[56] References Cited

U.S. PATENT DOCUMENTS

| | | | |
|---|---|---|---|
| 4,753,518 | 6/1988 | Clerc | 359/59 |
| 4,762,398 | 8/1988 | Yasui et al. | 359/59 |
| 4,775,861 | 10/1988 | Saito | 340/784 |
| 4,781,438 | 11/1988 | Noguchi | 359/68 |
| 4,792,210 | 12/1988 | Maurice | 359/59 |
| 4,834,505 | 5/1989 | Migliorato et al. | 359/59 |
| 4,894,690 | 1/1990 | Okabe et al. | 357/4 |
| 4,917,467 | 4/1990 | Chen et al. | 359/59 |
| 4,969,718 | 11/1990 | Noguchi et al. | 359/68 |

FOREIGN PATENT DOCUMENTS

| | | | |
|---|---|---|---|
| 0112700 | 7/1984 | European Pat. Off. | |
| 0182645 | 5/1986 | European Pat. Off. | |
| 0185995 | 7/1986 | European Pat. Off. | |
| 0001823 | 1/1990 | Japan | 340/784 |
| 0035493 | 2/1990 | Japan | 340/784 |
| 0193121 | 7/1990 | Japan | 359/59 |

Primary Examiner—William L. Sikes
Assistant Examiner—Huy K. Mai
Attorney, Agent, or Firm—Nixon & Vanderhye

[57] ABSTRACT

An active matrix display device which includes a pair of insulated substrates, pixel electrodes arranged in matrix on an inner side of one of the pair of insulated substrates, each pixel electrode being provided with at least a pair of TFTs including gate electrodes and drain electrodes, wherein the gate electrodes are formed in symmetrical shapes with respect to a central plane passing through a center between the pair of TFTs, thereby ensuring that the parasitic capacitance of the TFTs remain constant irrespective of a possible displacement of the drain electrodes and keeping the display device free from flickers due to differentiated parasitic capacitances.

6 Claims, 6 Drawing Sheets

ACTIVE MATRIX DISPLAY DEVICE HAVING DRAIN ELECTRODES OF THE PAIR OF TFTS BEING SYMMETRICALLY FORMED WITH RESPECT TO THE CENTRAL PLANE TO PREVENT THE FLICKER DUE TO THE DIFFERENT PARASITIC CAPACITANCES

RELATED APPLICATION

This application is related to U.S. Patent application Ser. No. 07/647,634 filed Jan. 31, 1991 entitled "An Active Matrix Display Device" and naming Kanemori et al as inventors.

1. Field of the Invention

The present invention relates generally to an active matrix display device, and more particularly to an active matrix display device using a display medium such as a liquid crystal and employing a switching device such as a thin film transistor (hereinafter called "TFT").

2. Description of the Prior Art

TFTs are in common use as a switching element for active matrix display devices. The TFTs used in the pixel electrodes reduce cross-talk between the pixels, and allows a limitless number of scanning lines. As a result, the active matrix display device has a larger capacity for display images and achieves a higher-precision image quality than a simple matrix display device.

To explain the background of the present invention, reference will be made to FIGS. 4 and 5:

Gate buses 4 are arranged in parallel with each other on an active matrix substrate, with the interposition of pixel electrodes 5 between one gate bus and the adjacent gate bus. The gate buses in the odd-numbered order are indicated by 4a and those in the even-numbered order are indicated by 4b. The pixel electrodes connected to the gate buses 4a are indicated by 5a, and those connected to the gate buses 4b are indicated by 5b. As shown in FIG. 4, the pixel electrodes 5a and 5b arranged in columns in parallel with the gate bases 5a and 5b are aligned with each other, and those in the adjacent columns are displaced from each other by half the side of each pixel electrode along the gate buses 4a and 4b. Three pixel electrodes arranged in a triangle displaying red, green and yellow constitute a unit. Source buses 6 are arranged in a zig-zag form among the pixel electrodes 5a and 5b. The pixel electrode 5a is provided with a TFT 1 (FIG. 8) which includes a TFT 1a connected to the gate bus 4a and TFT 1b connected to the gate bus 4b. The TFT 1a is formed on a gate electrode 10a extended from the gate bus 4a at a right angle thereto. The pixel electrodes 5a are connected to drain electrodes 8a of the TFT 1a, and a source electrode 9a of the TFT 1a is connected to the source bus 6. Likewise, the TFT 1b is formed on a gate electrode 10b extended from the gate bus 4b at a right angle. The pixel electrode 5b is connected to a drain electrode 8b. The source electrode 9b of the TFT 1b is connected to the source bus 6. The position of the drain electrode 8a to the gate electrode 10a of the TFT 1a and that of the drain electrode 8b to the gate electrode 10b of the TFT 1b are mutually in opposite directions along the extension of the gate bus 4. Additional capacitor lines 7 are provided for each pixel electrode 5. Part of each additional capacitor line 7 functions as an additional capacitor electrode for the pixel electrode 5. In FIG. 4, the additional capacitor line 7 is omitted.

Figure 6:
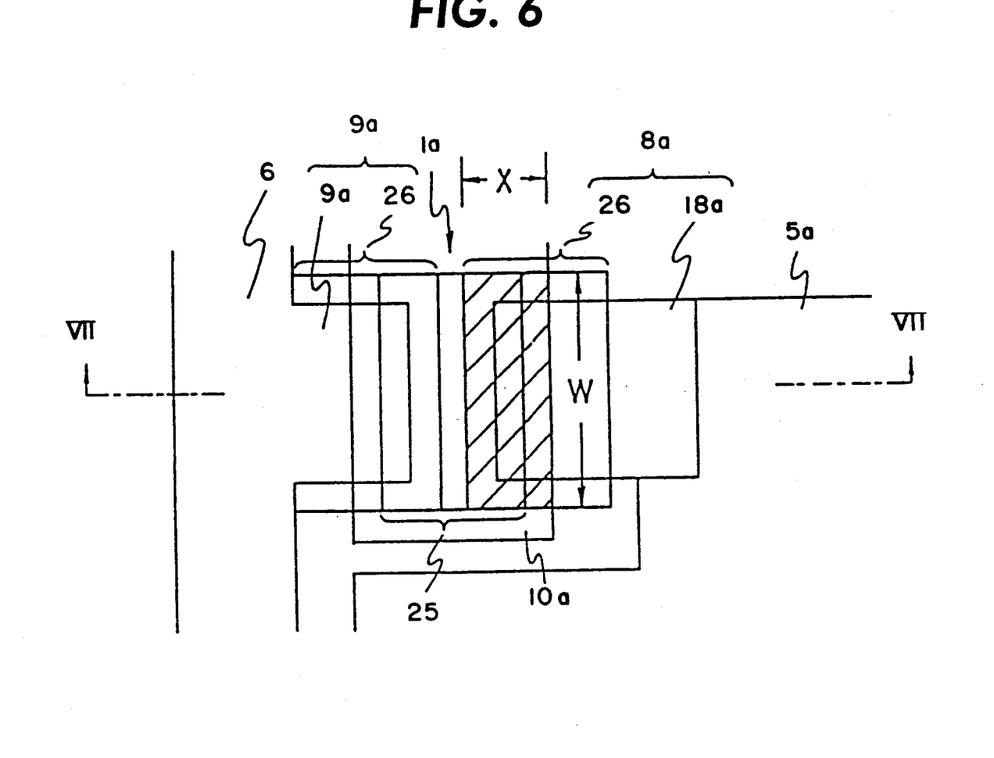
FIG. 6 is a partial plan view on an enlarged scale showing the TFT section of FIG. 5.
Figure 7:
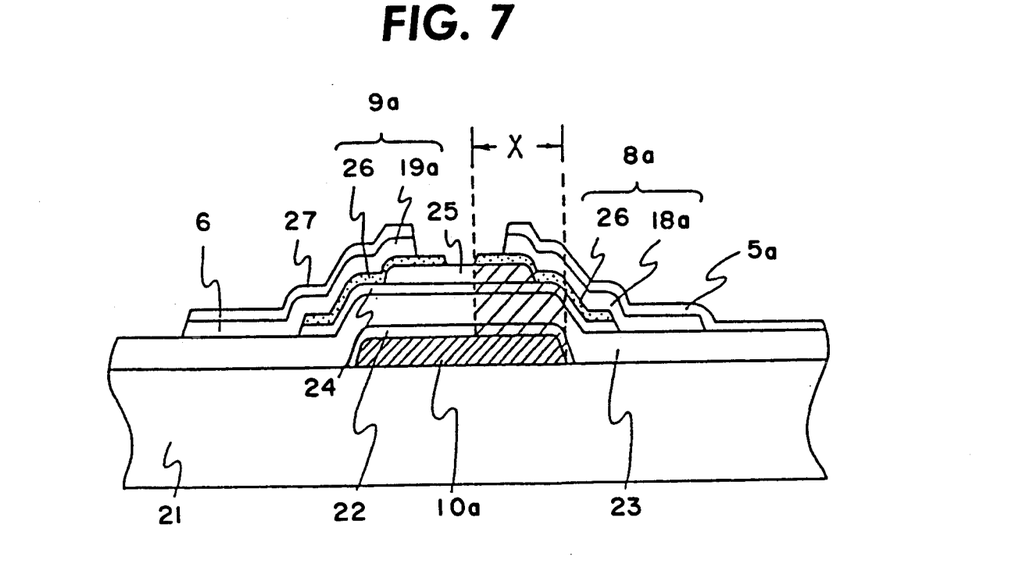
FIG. 7 is a cross-sectional view taken along the line VII—VII in FIG. 6.

Referring to FIGS. 6 and 7, the internal construction shared by the TFTs 1a, 1b and so on will be described.

The cross-sectional shapes of the TFTs 1a and 1b are symmetrical to each other. As shown in FIG. 7, the TFT 1a has the gate electrode 10a patterned on the glass substrate 21 and an anode oxidized film layer 22 wholly covered with a gate insulating layer 23. On the gate insulating layer 23 are a channel layer 24, a channel protective layer 25, a contact layer 26, a source metal layer 19a and a drain metal layer 18a. The pixel electrodes 5a are formed with ITO (Indium Tin Oxide) on the drain 10 metal layer 18a. An ITO layer 27 is formed at the same time as the pixel electrodes 5a are formed. The contact layer 26 and the drain metal layer 18a constitute the source electrode 9a. Likewise, the contact layer 26 and the drain metal layer 18a constitute the drain electrode 8a.

Figure 8:
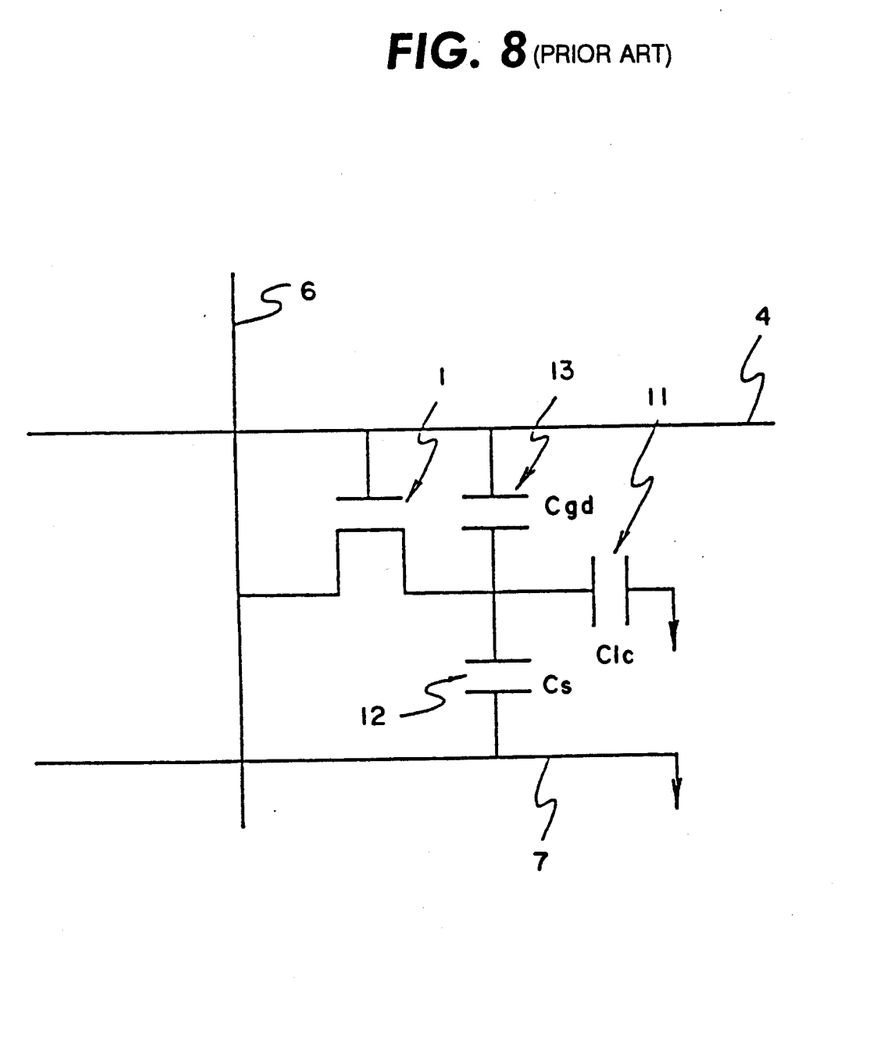
FIG. 8 is an equivalent circuit diagram used in the active matrix substrate of FIG. 4.

FIG. 8 is an equivalent circuit for the active matrix substrate described above. The TFTs 1 of this active matrix substrate are connected to a pixel capacitor 11 constituted by the pixel electrode 5 and a counter electrode, and a liquid crystal layer, an additional capacitor 12 constituted by a pixel electrode 5, the gate insulting layer 23 and the additional capacitor line 7, and a parasitic capacitance 13 constituted by the gate electrode 10a (or 10b). As shown in FIG. 6, the parasitic capacitance 13 is formed in the overlapping portions of the gate electrode 10a (or 10b) and the drain electrode 8a (or 8b). In FIG. 6, the overlapping portions are indicated by hatching, having an area of X×W. If the drain electrode 8a is formed at a displaced position, the parasitic capacitance will have a different capacity.

As described above, the position of the drain electrode 8a to the gate electrode 10a of the TFT 1a and that of the drain electrode 8b to the gate electrode 10b of the TFT 1b are mutually in opposite directions along the extension of the gate bus 4. The drain electrodes 8a and 8b of the TFTs 1a and 1b are formed by patterning. If they are formed at displaced positions from predetermined positions along the extension of the gate bus 4, the area of the overlapping portions of the gate electrode 10a and the drain electrode 8a of the TFT 1a will be different from that of the overlapping portions of the gate electrode 10b and the drain electrode 8b of the TFT 1b. As a result, the parasitic capacitance connected to the TFT 1a and that connected to the TFT 1b will become different in value.

When the gate electrode 10 of the TFT 1 is on, an a.c. signal applied to the drain electrode 8 from the source electrode 9 is transiently distributed to the pixel capacitor 11, the parasitic capacitor 13, and the additional capacitor 12. In general, the parasitic capacitor of the TFT is greater than that of the MOS-FET, and owing to it, the voltage waveform of the a.c. signal becomes unsymmetrical. The non-symmetry causes an off-set DC voltage component, and thereby causes detrimental flickers. In order to prevent flickers from resulting from the parasitic capacitance of the TFT, the common practice is to apply a DC component to the counter electrodes located on the opposite side of the liquid crystal layer, so as to compensate for the off-set DC voltage.

Figure 4:
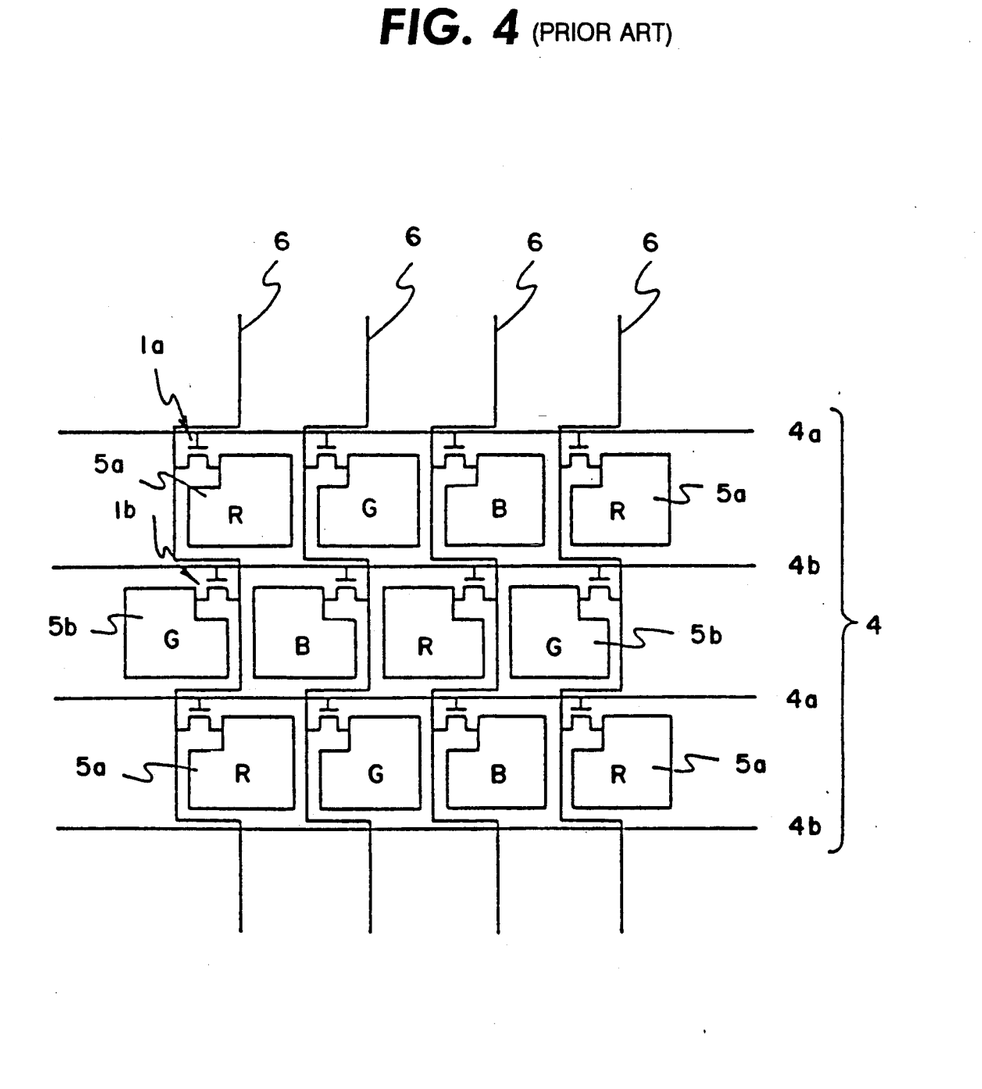
FIG. 4 is a diagrammatic view showing a known active matrix substrate employed in a known color liquid crystal display device.
Figure 5:
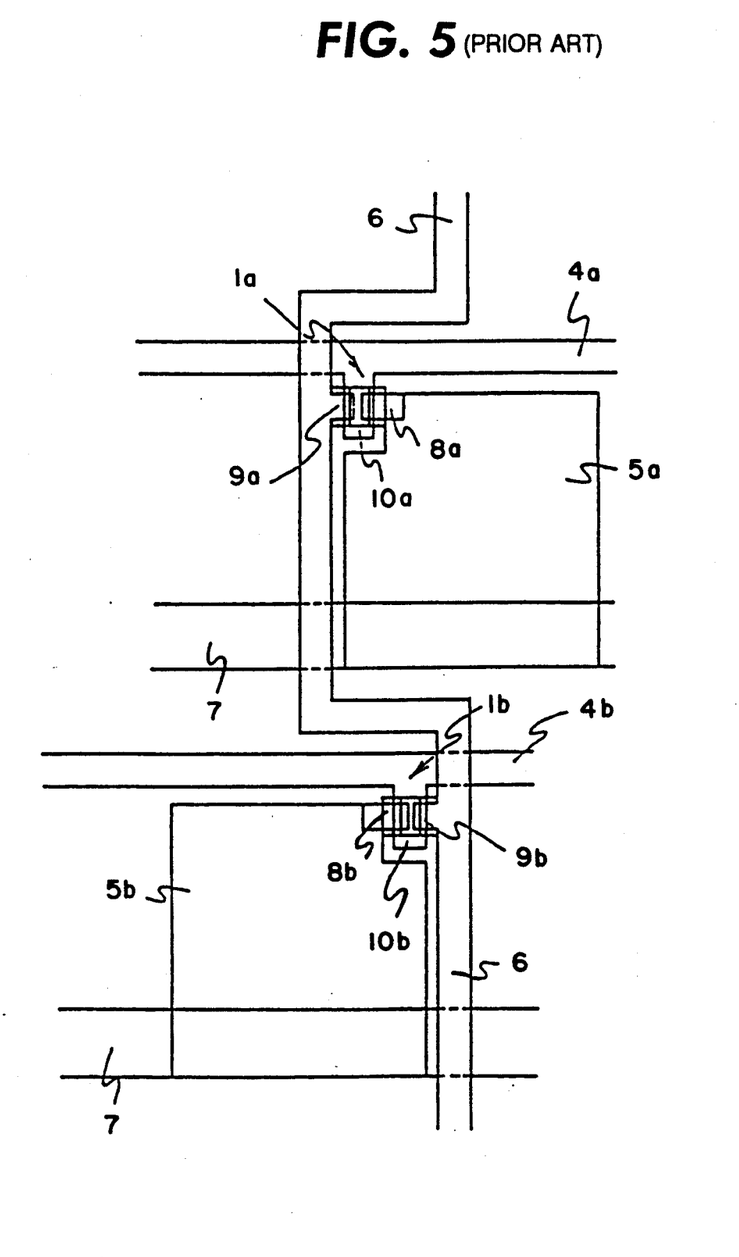
FIG. 5 is a partial plan view on an enlarged scale showing the active matrix substrate of FIG. 4.

In the known active matrix display device shown in FIGS. 4 and 5, since the parasitic capacitance of the TFT 1a connected to the gate bus 4a in the odd-numbered order and the parasitic capacitance of the TFT 1b connected to the gate bus 4b in the even-numbered order differ in size, the voltage applied to the counter electrodes can only compensate for the parasitic capacitance either of the TFT 1a or the TFT 1b. As a result, a DC component is applied to the pixel electrodes 5 connected to the TFT 1 whose parasitic capacitance is not compensated. The display device is subjected to flickers.

SUMMARY OF THE INVENTION

The active matrix display device of this invention, which overcomes the above-discussed and numerous other disadvantages and deficiencies of the prior art, comprises a pair of insulated substrates, pixel electrodes arranged in matrix on an inner side of one of the pair of insulated substrates, gate buses arranged between the pixel electrodes, at least one pair of thin film transistors disposed for each pixel electrode, each thin film transistor including a gate electrode and a drain electrode, wherein the gate electrodes of each pair of thin film transistors are formed in symmetrical forms with respect to a central plane passing through a center between the pair of thin film transistors, the gate electrodes being perpendicular to the direction of the gate buses, and wherein the pair of drain electrodes are formed in symmetrical shapes with respect to the central plane.

In a preferred embodiment, the pixel electrodes arranged in columns in parallel with the gate buses are aligned with each other, and the pixel electrodes in the adjacent columns are displaced from each other by half the side of each pixel electrode along the gate buses.

In a preferred embodiment, the pixel electrodes are connected to source buses arranged in a zigzag form therebetween.

Thus, the present invention described herein makes possible of the objective of providing an active matrix display device which ensures that no flickers occur even if TFTs have different parasitic capacitances.

A pixel electrode is provided with one or more pairs of TFTs, each pair of TFTs having gate electrodes and drain electrodes each formed in symmetrical shapes with respect to a central plane passing through a center between the paired TFTs. In addition, the gate electrodes of each pair of TFTs are positioned perpendicular to the gate buses. This arrangement is advantageous in that if the drain electrode is patterned at a displaced position in the direction of the gate buses, one of the TFTs has an increased overlapping portion of the gate electrode and the drain electrode wherein the other TFT has a decreased overlapping portion thereof. Thus, the parasitic capacitances of the TFTs are kept constant irrespective of the displacement of the drain electrodes, thereby keeping the display device free from flickers due to differentiated parasitic capacitances.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
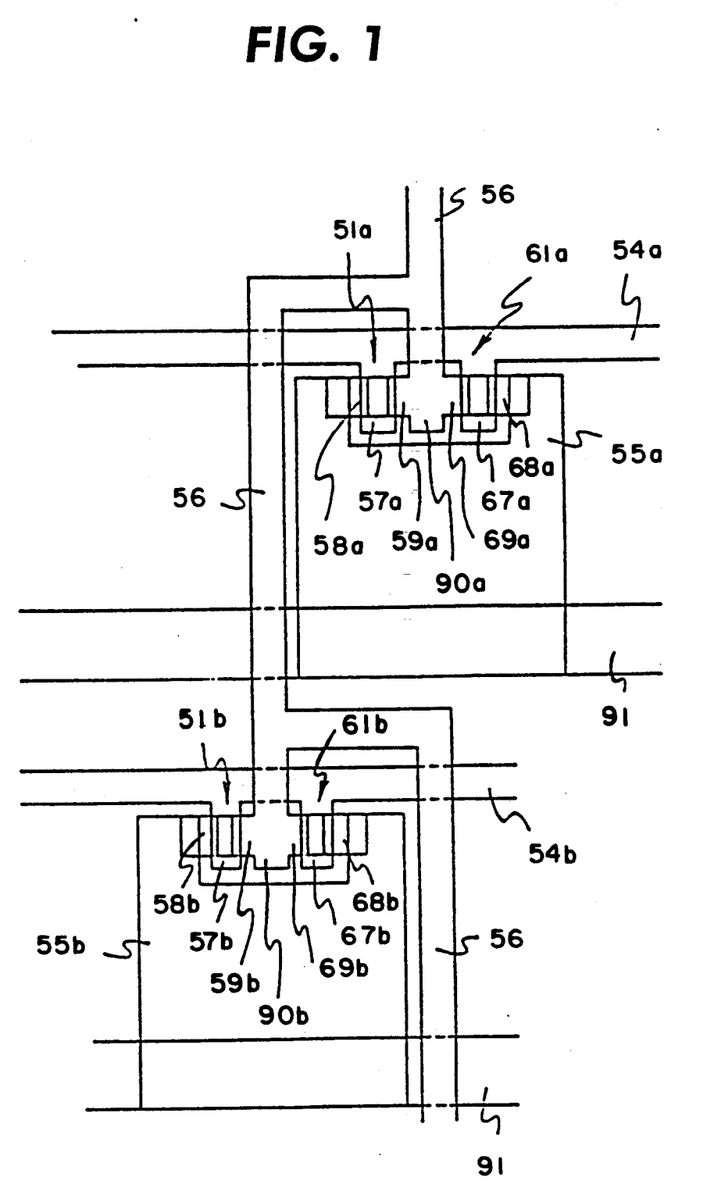
FIG. 1 is a plan view showing a portion of an active matrix substrate employed in an active matrix display device according to the present invention.

Referring to FIG. 1, a plurality of pixel electrodes 55 are formed on an insulated substrate, with gate buses 54 interposed in parallel between one pixel electrode 55 and the next. The gate bus 54 includes the gate buses 54a and 54b, and the pixel electrode 55 includes a pixel electrode 55a connected to the gate bus 54a and a pixel electrode 55b connected to the gate bus 54b. As referred to above, the pixel electrodes 55a and 55b in each columns in parallel with the gate buses 54a and 54b are aligned with each other, and those in adjacent columns are displaced from each other by half the side of the pixel electrode along the gate buses 54a and 54b as shown in FIG. 1. The source buses 56 are formed in a zigzag form among the pixel electrodes 55a and 55b.

The TFTs 51a and 61a are provided between the gate bus 54a and the pixel electrode 55a. Likewise, the TFTs 51b and 61b are provided between the gate bus 54b and the pixel electrode 55b. The TFTs 51b and 61b are formed on the gate electrodes 57a and 67a extended from the gate bus 54a at a right angle thereto. The gate electrodes 57a and 67a, the drain electrodes 58a and 68a, and the source electrodes 59a and 69a of the TFTs 51a and 61a are symmetrically formed with respect to a central plane (CP) located at the center between the TFTs 51a and 61a. The pixel electrode 55a is connected to the drain electrodes 58a and 68a of the TFTs 51a and 61a. The source electrodes 59a and 69a of the TFTs 51a and 61a are connected to an extension 90a of the source bus 56.

Likewise, the TFTs 51b and 61b are formed on the gate electrodes 57b and 67b extended from the gate bus 54b at a right angle thereto. The gate electrodes 57b and 67b, the drain electrodes 58b and 68b, and the source electrodes 59b and 69b of the TFTs 51b and 61b are symmetrically formed with respect to a central plane (CP) located at the center between the TFTs 51b and 61b. The pixel electrode 55b is connected to the drain electrodes 58b and 68b of the TFTs 51b and 61b. The source electrodes 59b and 69b of the TFTs 51b and 61b are connected to an extension 90b of the source bus 56. An additional capacitor line 91 is provided for each of the pixel electrodes 55a, 55b. Part of the additional capacitor lines 91 function as additional capacitor electrodes against the respective pixel electrodes 55.

Figure 2:
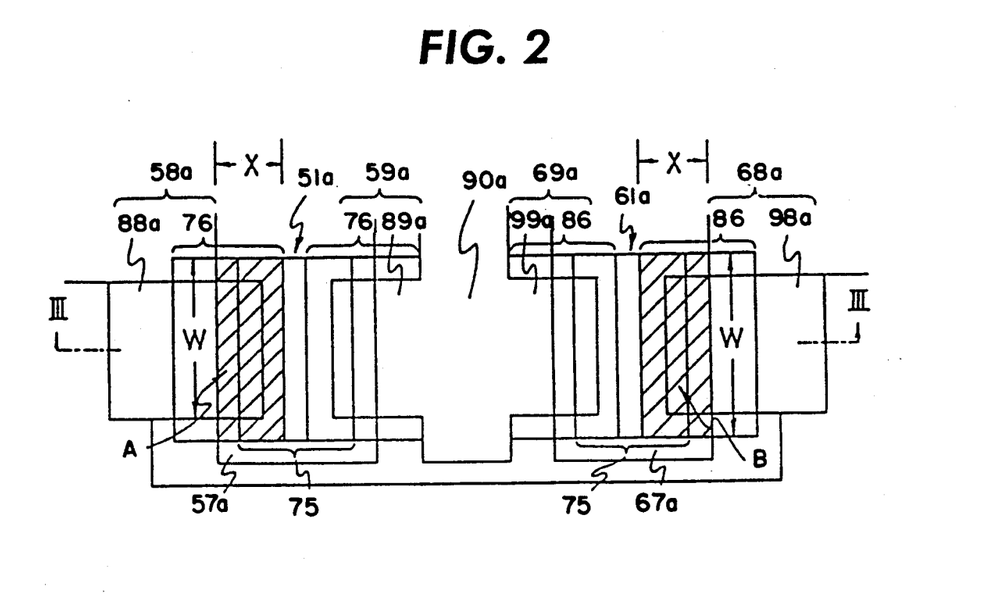
FIG. 2 is a plan view on an enlarged scale showing TFT sections of the substrate of FIG. 1.
Figure 3:
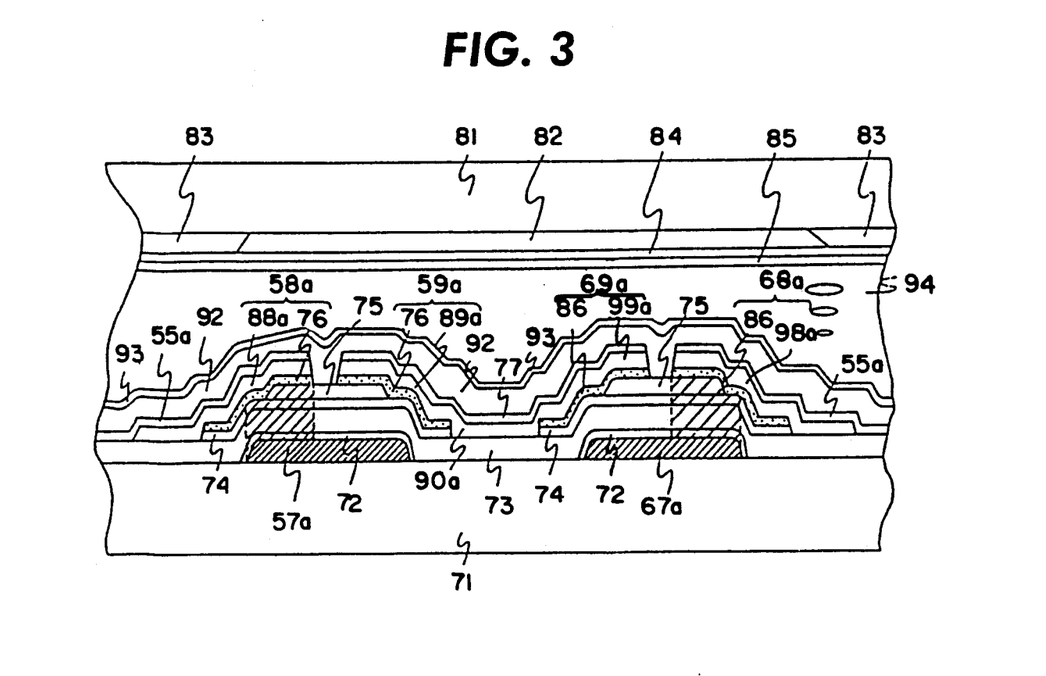
FIG. 3 is a cross-sectional view taken along the line III—III in FIG. 2.

Referring to FIGS. 2 and 3, an active matrix display device according to the present invention will be described in the order of the steps taken to fabricate it:

A glass substrate 71 was prepared, on which a film having a thickness of 3000 Å was formed with Ta. The Ta film was patterned by photolithography or etching so as to form the gate buses 54a and 54b, the gate electrodes 57a, 57b, 67a and 67b, and the additional capacitor lines 91 were formed. Then, the gate buses 54a and 54b, the gate electrodes 57a, 57b, 67a and 67b, and the additional capacitor lines 91 were subjected to surface anodizing. In this way these lines and electrodes were covered with anodized layer 72 of $Ta_2O_5$.

Then, a gate insulating layer 73 having a thickness of 3000 Å was formed with silicone nitride (SiN$_x$) by a plasma CVD method so as to cover the whole surface of the anodized layer 27. In addition, the gate insulating layer 73 was covered with an intrinsic amorphous silicone (a-Si(i)) layer having a thickness of 300 Å, which formed channel layers 74 at a later stage, and a silicone nitride layer having a thickness of 2000 Å which formed channel protective layers 75.

Then, the silicone nitride layer was patterned by photolithography but of course it can be done by etching so as to form the channel protective layers 75 on the gate electrodes 57a, 57b, 67a and 67b.

Next, an n-type amorphous silicone (a-Si(n+)) layer was deposited by a CVD method, so as to form contact layers 76 and 86 at a later stage. The a-Si(i) layer and the a-Si(n+) layer were patterned by photolithography and etching. In this way the contact layers 76 and 86, and the channel layers 74 were formed. At this stage, the contact layers 76 and 86 are connected to each other on the channel layers 74.

Then, a metal layer was formed with Ti having a thickness of 3000 Å by sputtering. The Ti layer was patterned by photolithography and etching so as to form the source bus 56, the extensions 90a and 90b, the source metal layers 89a, 89b, 99a and 99b, the source metal layers 89a, 89b, 99a and 99b, and the drain metal layers 88a, 88b, 98a and 98b. At this stage, the channel protective layer 75 for the contact layers 76 and 86 and a central portion of the channel protective layer 75 were removed by etching. The contact layer 76 and the source metal layer 89a constituted the source electrode 59a, and the contact layer 86 and the source metal layer 99a constituted the source metal layer 69a. Likewise, the contact layer 76 and the drain metal layer 88a the drain electrode 58a, and the contact layer 86 and the drain metal layer 98a constituted the drain electrode 68a.

Then, an ITO layer having a thickness of 1000 Å was formed by sputtering. The ITO layer was patterned by photolithography and etching so as to form pixel electrodes 55a and 55b. The ITO layer 77 was retained on the source bus 56, the extensions 90a and 90b, the source metal layers 89a, 89b, 99a, and 99b, the drain metal layers 88a, 88b, 98a and 98b. A protective layer 92 having a thickness of 3000 Å was formed with SiN$_x$, on which an orientation layer 93 was additionally formed.

On the counter substrate 81 were formed a black stripe 82 and a color filter 83, and the counter electrode 84 of ITO and an orientation layer 85 were formed over the black stripe 82 and the color filter 83. The liquid crystal layer 94 is sandwiched between the two substrates 71 and 81. In this way a fabrication process of the active matrix display device is finished.

In the illustrated embodiment, the parasitic capacitance is formed in the portion indicated by hatching in FIG. 2: more specifically, the overlapping region A of the gate electrode 57a and the drain electrode 58a, and the overlapping region B of the gate electrode 67a and the drain electrode 68a. The areas SA of the region A and the area SB of the region B are equal in having the size of (X×W), where the X is the length of a minor side of the regions A and B along the gate bus 54, and the W is the length of a major side of the regions A and B in the direction perpendicular to the gate bus 54. As shown in FIG. 2, the gate electrodes 57a and 67a are symmetrically disposed on opposite sides of an imaginary central plane situated at a center between the TFTs 51a and 61a. Each gate electrode 57a and 57b is perpendicular to the gate buses 54. The drain electrodes 58a and 68a of the TFTs 51a and 61a are formed in symmetrical forms with respect to the imaginary central plane. This arrangement ensures that even if the drain electrodes 58a and 68a are displaced from a predetermined position in the direction of the gate bus 54, the total area of the regions A and B remains constant. Suppose that the drain electrodes 58a and 68a are displaced by Δ X from the normal positions along the gate bus 54, to the right in FIG. 2. The areas SA and SB of the regions A and B are calculated as follows:

$$SA = X(X + \Delta X) \times W$$

$$SB = (X - \Delta X) \times W$$

Therefore, the total of SA and SB is 2X×W. This means that the total area remains the same as if no displacement occurs in the positions of the drain electrodes 58a and 68a. This effect is also present in the TFTs 51b and 61b.

In the illustrated embodiment, a pair of TFTs are provided for a single pixel electrode, but the number of TFTs is not limited to one pair. A greater number of TFTs can be employed. When two or more pairs of TFTs are employed, it is only necessary to ensure that the gate electrodes and the drain electrodes of the TFTs of each pair are symmetrical with respect to the imaginary central plane (CP) passing through a center between the respective pair of TFTs.

As is evident from the foregoing description, each pixel electrode is provided with at least a pair of TFTs including gate electrodes and drain electrodes, wherein the gate electrodes are formed in symmetrical shapes with respect to a central plane (CP) passing through a center between the pair of TFTs. This arrangement ensures that the parasitic capacitances of the TFTs remain constant irrespective of a possible displacement of the drain electrodes, thereby keeping the display device free from flickers due to differentiated parasitic capacitances.

It will be appreciated from the foregoing description that the known high-precision, small-size active matrix display device reduces the display performance because of the low numerical aperture. When a display device having a large area covered by the light shield layer is used for a projection type display device, another problem arises as black spots in the image picture resulting from the light shield layers.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An active matrix display device comprising a pair of insulated substrates, pixel electrodes arranged in matrix on an inner side of one of the pair of insulated substrates, gate buses arranged between the pixel electrodes, at least one pair of thin film transistors disposed for each pixel electrode, each thin film transistors including a gate electrode which is electrically connected to and extends from a corresponding one of the gate buses and a drain electrode electrically connected to a corresponding one of the pixel electrodes, wherein the gate electrodes of each pair of thin film transistors are symmetrically formed with respect to a central plane passing through a center between the pair of thin film transistors, the gate electrodes being perpendicular to the direction of the gate buses, and wherein the drain electrodes of the pair of thin film transistors are symmetrically formed with respect to the central plane.

2. An active matrix display device according to claim 1, wherein the pixel electrodes arranged in columns in parallel with the gate buses are aligned with each other, and the pixel electrodes in the adjacent columns are disposed from each other by half the side of each pixel electrode along the gate buses.

3. An active matrix display device comprising a pair of insulated substrates, pixel electrodes arranged in matrix on an inner side of one of the pair of insulated substrates, gate buses arranged between the pixel electrodes, source buses arranged between the pixel electrodes perpendicularly intersecting the gate buses, each sources bus having an extended portion, at least one pair of thin film transistors disposed for each pixel electrode, each thin film transistor including a gate electrode which is electrically connected to end extends from a corresponding one of the gate buses and a drain electrode electrically connected to a corresponding one of the pixel electrodes, wherein the gate electrodes of each pair of thin film transistors are symmetrically formed with respect to a central plate passing through a center between the pair of thin film transistors, the central plane being positioned on the same position of the extended portion, the gate electrodes being perpendicular to the direction of the gate buses, and wherein the drain electrodes of the pair of thin film transistors are symmetrically formed with respect to the central plane.

4. An active matrix display device according to claim 3, wherein the pixel electrodes are connected to the source buses arranged in a zigzag form therebetween.

5. An active matrix display device according to claim 3, wherein the pixel electrodes are connected to the source buses arranged in a zigzag form therebetween on the alternate sides of the source bus.

6. An active matrix display device according to claim 3, wherein the pixel electrodes arranged in columns in parallel with the gate buses are aligned with each other, and the pixel electrodes in the adjacent columns are displaced from each other by half the side of each pixel electrode along the gate buses.

* * * * *

UNITED STATES PATENT AND TRADEMARK OFFICE
CERTIFICATE OF CORRECTION

PATENT NO. : 5,191,451
DATED : March 2, 1993
INVENTOR(S) : KATAYAMA ET AL.

It is certified that error appears in the above-indentified patent and that said Letters Patent is hereby corrected as shown below:

IN THE DRAWINGS:

Figs. 6 and 7 should be labelled "PRIOR ART".

Column 8, line 1, "end" should be --and--;

Column 8, line 6, "plate" should be --plane--.

Signed and Sealed this

Fifteenth Day of February, 1994

Attest:

BRUCE LEHMAN

Attesting Officer   Commissioner of Patents and Trademarks

UNITED STATES PATENT AND TRADEMARK OFFICE
CERTIFICATE OF CORRECTION

PATENT NO. : 5,191,451

DATED : March 2, 1993

INVENTOR(S) : Mikio Katayama; et al

It is certified that error appears in the above-indentified patent and that said Letters Patent is hereby corrected as shown below:

In the drawings,
Figures 2, 3, 6 and 7 should be deleted and replaced with the attached sheets.

Signed and Sealed this

Twenty-fifth Day of October, 1994

BRUCE LEHMAN

Attest:

Attesting Officer

Commissioner of Patents and Trademarks